United States Patent
Lee et al.

(10) Patent No.: US 8,830,728 B2
(45) Date of Patent: Sep. 9, 2014

(54) RESISTANCE CHANGE MEMORY DEVICE AND CURRENT TRIMMING METHOD THEREOF

(75) Inventors: Jung Hyuk Lee, Yongin-si (KR); Daewon Ha, Seoul (KR); Kyu-Rie Sim, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 129 days.

(21) Appl. No.: 13/554,146

(22) Filed: Jul. 20, 2012

(65) Prior Publication Data

US 2013/0051123 A1  Feb. 28, 2013

(30) Foreign Application Priority Data

Aug. 22, 2011  (KR) .................. 10-2011-0083412

(51) Int. Cl.
| | | |
|---|---|---|
| G11C 11/00 | (2006.01) | |
| G11C 8/00 | (2006.01) | |
| G11C 29/02 | (2006.01) | |
| G11C 13/00 | (2006.01) | |
| G11C 17/16 | (2006.01) | |
| G11C 11/16 | (2006.01) | |
| G11C 29/50 | (2006.01) | |

(52) U.S. Cl.
CPC .......... *G11C 8/00* (2013.01); *G11C 2013/0076* (2013.01); *G11C 13/0069* (2013.01); *G11C 13/0007* (2013.01); *G11C 17/16* (2013.01); *G11C 29/021* (2013.01); *G11C 13/0004* (2013.01); *G11C 29/028* (2013.01); *G11C 13/0038* (2013.01); *G11C 2013/0092* (2013.01); *G11C 11/16* (2013.01); *G11C 2029/5006* (2013.01); *G11C 2013/0083* (2013.01); *G11C 13/00* (2013.01)
USPC .............................. 365/148; 365/163; 365/63

(58) Field of Classification Search
USPC .................... 365/148, 163, 63, 189.16; 257/2
See application file for complete search history.

(56) References Cited

U.S. PATENT DOCUMENTS

| | | | |
|---|---|---|---|
| 7,130,214 B2 | 10/2006 | Lee | |
| 7,242,605 B2 | 7/2007 | Choi et al. | |
| 7,379,328 B2 * | 5/2008 | Osada et al. | 365/163 |
| 7,646,632 B2 | 1/2010 | Philipp et al. | |
| 7,821,810 B2 | 10/2010 | Liu | |
| 7,889,548 B2 * | 2/2011 | Jeong et al. | 365/163 |
| 7,907,437 B2 | 3/2011 | Lee et al. | |
| 2008/0074919 A1 | 3/2008 | Lim et al. | |

FOREIGN PATENT DOCUMENTS

| | | |
|---|---|---|
| KR | 10-2004-0087153 A | 10/2004 |
| KR | 10-2005-0030294 A | 3/2005 |
| KR | 10-2005-0118332 A | 12/2005 |
| KR | 10-2008-0028215 A | 3/2008 |
| KR | 10-2009-0123244 A | 12/2009 |
| KR | 10-2010-0132975 A | 12/2010 |
| WO | WO 2009/114200 A1 | 9/2009 |

* cited by examiner

*Primary Examiner* — David Lam
(74) *Attorney, Agent, or Firm* — Lee & Morse, P.C.

(57) ABSTRACT

A resistance change memory device includes an array of resistance change memory cells, and a writing circuit configured to reset a selected memory cell to a high resistance state by supplying a RESET current to the selected memory cell in the array of resistance change memory cells in a program operation mode, wherein a level of the RESET current depends on a distribution of initial RESET currents for the array of resistance change memory cells.

16 Claims, 10 Drawing Sheets

| Mode | Case1 | Case2 |
|---|---|---|
| WBI | RRCV×RA_F1 | RRCV×RA_F2 |
| Reset | RRCV×RA_R1 | RRCV×RA_R2 |
| Set | RRCV×RA_S1 | RRCV×RA_S2 |

RESISTANCE CHANGE MEMORY DEVICE AND CURRENT TRIMMING METHOD THEREOF

CROSS-REFERENCE TO RELATED APPLICATIONS

This U.S. non-provisional patent application claims priority under 35 U.S.C. §119 of Korean Patent Application No. 10-2011-0083412, filed on Aug. 22, 2011, the entire contents of which are hereby incorporated by reference.

BACKGROUND

1. Field

Embodiments relate to a resistance change memory device and a current trimming method thereof.

2. Description of the Related Art

Semiconductor memory devices are used to store data, and include volatile semiconductor memory devices and nonvolatile semiconductor memory devices. In a volatile semiconductor memory device, data may be stored by charge and discharge of a capacitor or a latch operation of flip flop. In a volatile semiconductor memory device such as a random access memory (RAM), data may be stored and read while power supplies are provided, and data may be lost when the power supplies are interrupted. The volatile semiconductor memory devices are frequently used as a main memory of computer. The nonvolatile semiconductor memory devices can store data even when power supplies are interrupted. The nonvolatile semiconductor memory devices may be used to store program and data permanently, and are widely applied to a computer, mobile communications, or the like.

SUMMARY

Embodiments are directed to a resistance change memory device, including an array of resistance change memory cells, and a writing circuit configured to reset a selected memory cell to a high resistance state by supplying a RESET current to the selected memory cell in the array of resistance change memory cells in a program operation mode, wherein a level of the RESET current depends on a distribution of initial RESET currents for the array of resistance change memory cells.

The resistance change memory cells may be constituted by phase change memory cells changed to an amorphous state by the RESET current.

The distribution of initial RESET currents may be measured after performing, one or more times, a SET program or a RESET program on the resistance change memory cells.

The level of RESET current may be calculated by determining a representative RESET current value for the array of resistance change memory cells on the basis of a peak value of the distribution of initial RESET currents and then multiplying the determined representative RESET current value by a RESET program ratio.

The level of RESET current may be calculated by: determining a representative RESET current value for the array of resistance change memory cells on the basis of a central value of the distribution of initial RESET currents, and then: adding a RESET program control value to the determined representative RESET current value, or subtracting a RESET program control value from the determined representative RESET current value.

The writing circuit may be operationally connected to a trimming circuit for trimming a program current level.

The trimming circuit may include at least one of a fuse, an anti-fuse, and a nonvolatile memory.

The resistance change memory device may be operable in a firing operation mode, in which: the writing circuit supplies a firing current to memory cells in the array of resistance change memory cells, and a level of the firing current is determined by multiplying a representative RESET current value, obtained on the basis of the distribution of initial RESET current, by a firing ratio.

A wafer burn-in operation may be performed in the firing operation mode.

The resistance change memory device may be operable in a firing operation mode, in which: the writing circuit supplies a firing current to memory cells in the array of resistance change memory cells, and a level of the firing current is determined by: adding a representative RESET current value, obtained on the basis of the distribution of initial RESET current, to a firing ratio, or subtracting a representative RESET current value, obtained on the basis of the distribution of initial RESET current, from a firing ratio.

Embodiments are also directed to a method of current trimming a memory, the method including measuring a distribution of initial RESET currents for an array of resistance change memory cells, determining a representative RESET current value for the array of resistance change memory cells on the basis of the distribution of initial RESET currents, and determining a level of program current on the basis of the representative RESET current value.

The level of the program current may be determined by multiplying the representative RESET current value by a program ratio.

The memory may be operable in a RESET program operation mode, and the program ratio may be a RESET program ratio.

The memory may be operable in a SET program operation mode, and the program ratio may be a SET program ratio.

The method may further include a wafer burn-in operation mode, the wafer burn-in operation mode including determining a level of wafer burn-in current on the basis of the representative current value.

Embodiments are also directed to a method of programming a memory device that includes a memory array of variable resistance memory cells, the method including identifying a variable resistance memory cell, among the variable resistance memory cells of the memory array, that is to be programmed, after identifying the variable resistance memory cell, determining a first state of the variable resistance memory cell, the first state being either a RESET state or a SET state, and after determining the first state of the variable resistance memory cell, changing the first state of the variable resistance memory cell to a second state by applying a pulse of electrical current to the variable resistance memory cell, the second state being different from the first state, the second state being either the RESET state or the SET state, the pulse of electrical current including a first current component and a second current component, the first current component being derived from a RESET current distribution obtained by wafer-level testing of the memory array and at least one other memory array, the memory array and the at least one other memory array having been fabricated on a same wafer.

The second state may be the RESET state, and the second current component may be a preset RESET current having a magnitude that is determined prior to fabrication of the wafer.

The pulse of electrical current may be fixed by opening one or more fuses in the memory device after fabrication of the wafer, the fuses that are opened being determined with reference to the RESET current distribution.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
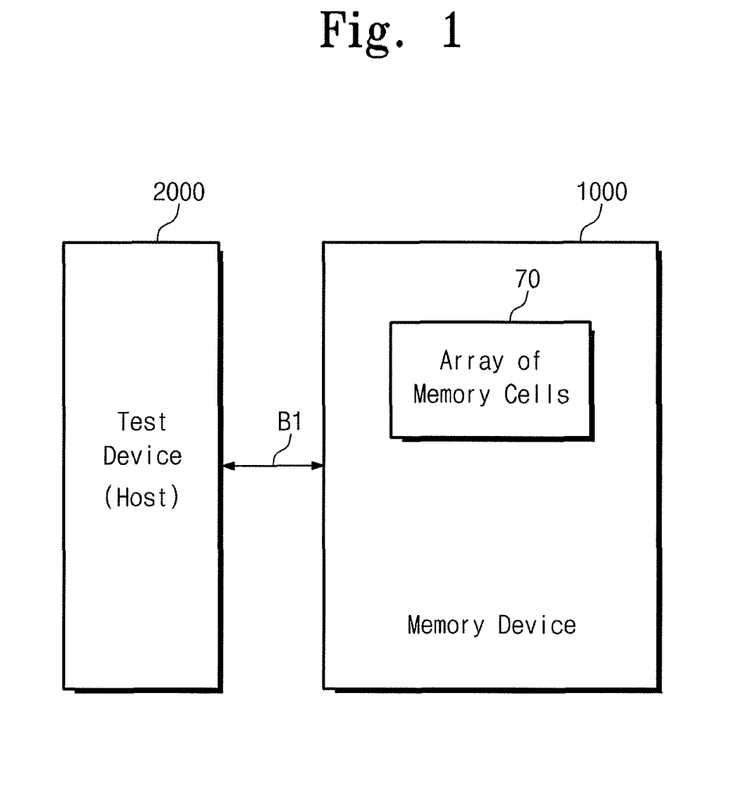
FIG. 1 illustrates a block diagram of system including a memory device in accordance with some embodiments.

FIG. 1 illustrates a block diagram of system including a memory device in accordance with some embodiments.

In the example embodiment shown in FIG. 1, the system includes a test device 2000 and a memory device 1000. The test device 2000 may include a program-performing device such as a microprocessor, and may test or manage the memory device 100 through a bus B1.

In a test operation, a wafer burn-in may be performed on the memory device 1000. The wafer burn-in may be used in screening a memory device for defects, and may be included in a firing execution operation. In the case that the memory device 1000 is adopted in a system after being tested, the memory device 1000 may be connected to a host through the bus B1.

Figure 2:
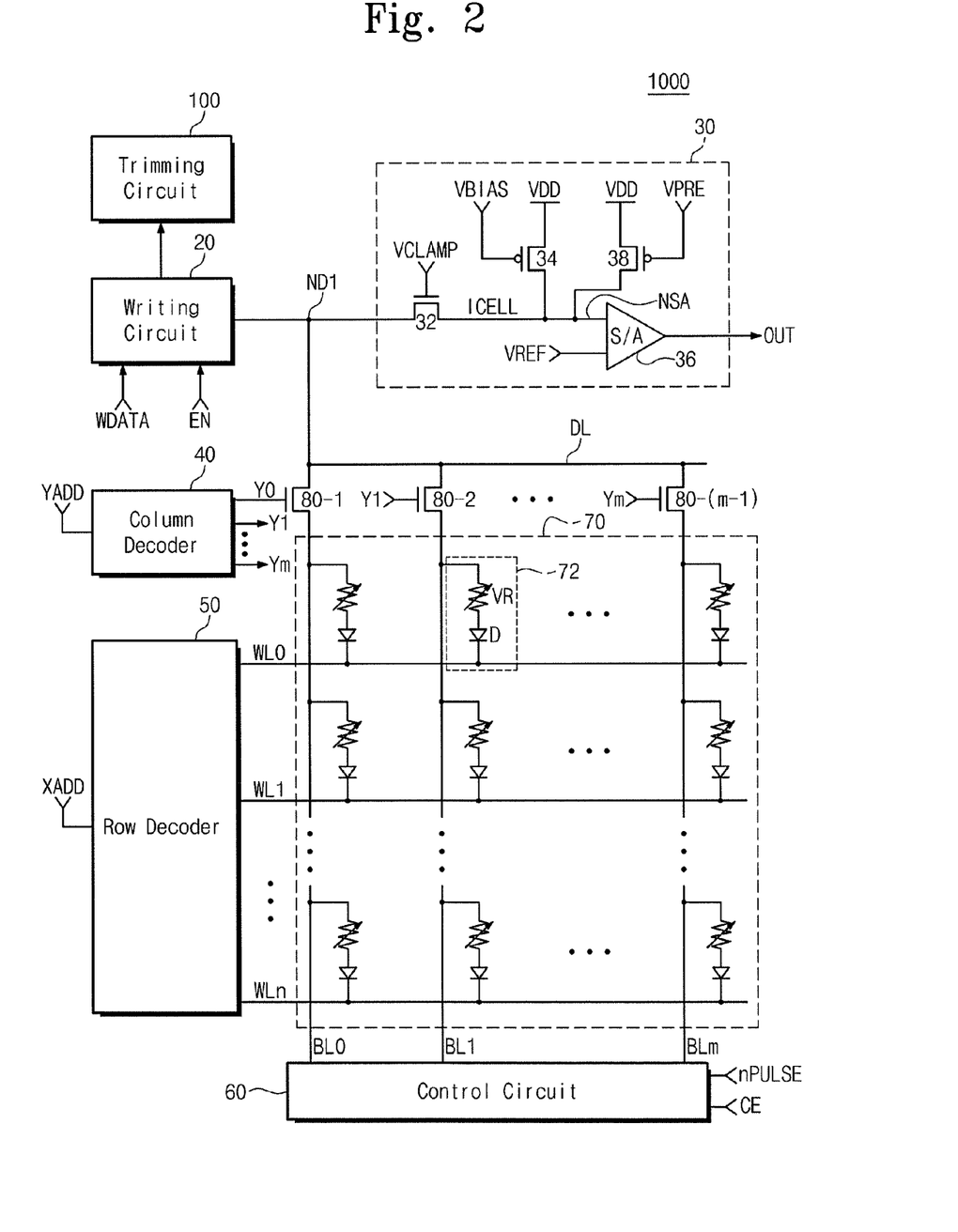
FIG. 2 illustrates a detailed circuit diagram of an example of the memory device of FIG. 1.

A resistance change memory device may include circuit blocks illustrated in FIG. 2.

FIG. 2 illustrates a detailed circuit diagram of an example of the memory device of FIG. 1.

In the example embodiment shown in FIG. 2, the resistance change memory device 1000 may include a trimming circuit 100, a writing circuit 20, a read circuit 30, a column decoder 40, a row decoder 50, a control circuit 60, and a memory cell array 70.

The memory device 1000 may have the array 70 of resistance change memory cells as a storage device. In FIG. 2, the resistance change memory device 1000 may be a PRAM, and each of memory cells 72 constituting the memory cell array 70 may be a phase change memory cell that includes a variable resistance device VR (formed of a phase change material such as GST) and an access diode D.

For brevity of description, a technique of minimizing or reducing an error of RESET program or an error of SET return program will be described mainly with a PRAM in some embodiments. However, the technique may be applied to a RRAM, a MRAM, or the like.

A cathode of diode D constituting a part of the phase change memory cell 72 may be connected to a word line WL (WL may be, e.g., WL0, WL1, ..., WLn) constituting a row of the memory cell array 70, and one end of the variable resistance device VR may be connected to a bit line BL constituting a column of the memory cell array 70.

A phase change characteristic of the phase change memory cell 72 and a basic principle of operation of writing (or programming) write data in the phase change memory cell 72 will be described with reference to FIG. 3.

Figure 3:
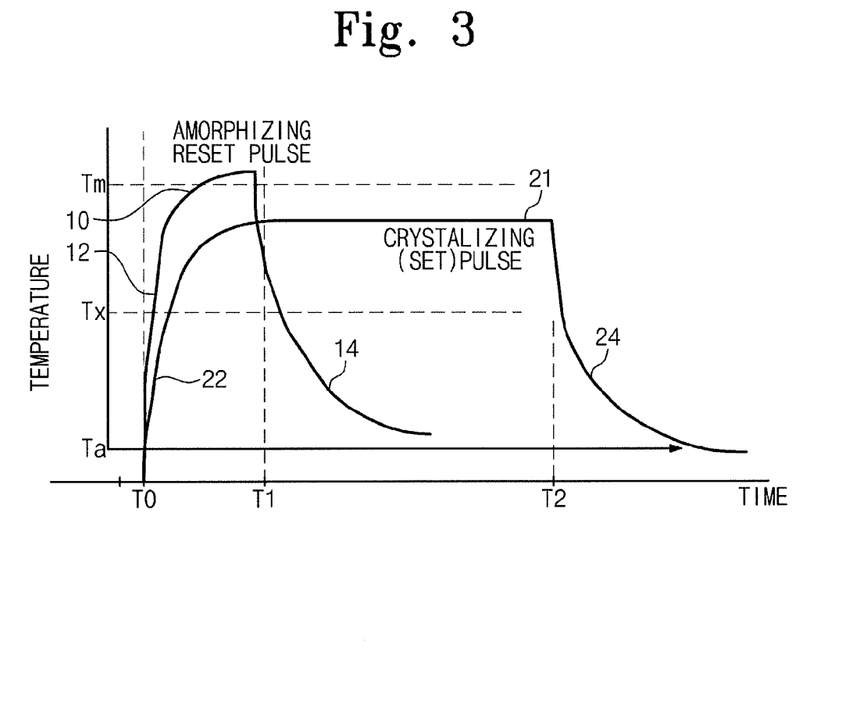
FIG. 3 illustrates a graph showing a phase change characteristic of memory cell being applied to FIG. 2.
Figure 4:
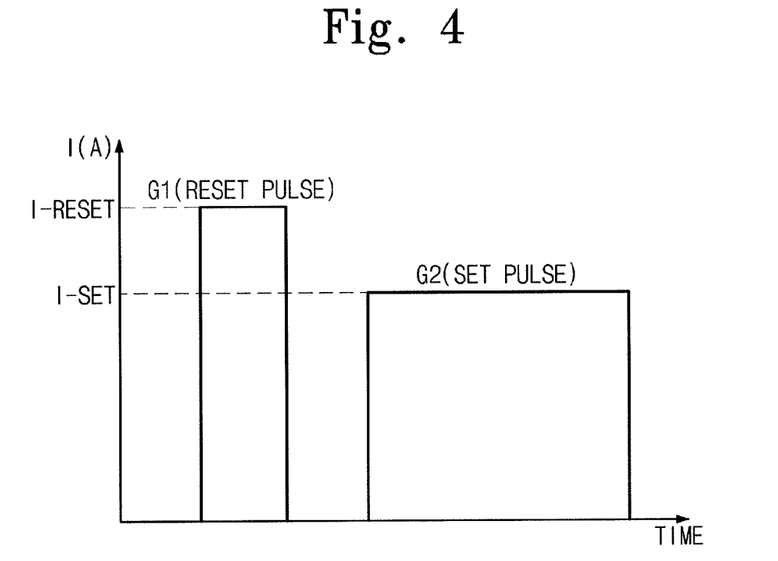
FIG. 4 illustrates a graph showing waveforms of current pulses being applied when programming data in the memory cell being applied to FIG. 2.

FIG. 3 illustrates a graph showing a phase change characteristic of memory cell being applied to FIG. 2. FIG. 4 illustrates a graph showing waveforms of current pulses being applied when programming data in the memory cell being applied to FIG. 2.

Referring to FIG. 3, the graph shows a phase change characteristic of time relative to temperature with respect to a phase change material GST. In the graph, a horizontal axis represents time and a vertical axis represents temperature T.

An amorphous state of the phase change material GST, as indicated by graph reference numerals 12, 10, and 14, is obtained by rapidly cooling the phase change material GST after heating the phase change material GST above a melting temperature. A crystalline state of the phase change material GST, as indicated by graph reference numerals 22, 21, and 24, is obtained by cooling the phase change material GST after heating the phase change material GST above a crystallization temperature for a specified time.

Waveforms of current pulses for making the phase change material GST become an amorphous state and a crystalline state may be as shown in FIG. 4.

Referring to FIG. 4, waveforms of current pulses for changing the phase change memory cell 72 to a first state and a second state are illustrated. In FIG. 4, a horizontal axis represents time and a vertical axis represents current I. A level of RESET current pulse G1 is higher than a level of SET current pulse G2. A time of supplying the SET current pulse G2 is longer than a time of supplying the RESET current pulse G1. The RESET current pulse G1 and the SET current pulse G2 may mean that a write (program) current is applied to the phase change memory cell to store binary 1 or binary 0 when performing a write operation mode.

A case in which the state of the phase change material GST is changed from the amorphous state to the crystalline state may be defined as a SET, and the case in which the state of the phase change material GST is changed from the crystalline state to the amorphous state may be defined as a RESET. A resistance of the amorphous state of the phase change material GST is greater than the resistance of the crystalline state of the phase change material GST.

Methods of changing the state of the phase change material GST include a method of using a laser beam and a method of using a current. The method of using a current may be preferred as being easier to implement in a memory chip. When applying the method of using a current, the current pulses shown in FIG. 4 may be selectively generated through the writing circuit 20 of FIG. 2, and may be provided to a bit line through the selected column gate among column gates 80-1, 80-2, . . . 80(m-1) to write data. The phase change material GST may become the SET state or the RESET state by joule heating generated according to the magnitude of current and the supplying time of the current (see FIGS. 3 and 4).

When making the selected memory cell become the RESET state, if a current of reset pulse is relatively weak, a reset operation may not be well performed and, if the current of reset pulse is relatively strong, endurance performance of memory cell may deteriorate or it may become difficult to change a memory cell to the SET state. However, when manufacturing memory cells of PRAM, a current level may be changed due to a process variation. For example, the RESET current of the memory cell may be changed by a critical dimension CD and a width of a lower electrode under the GST, an interface state between the lower electrode and the GST, and/or a height, thickness, or concentration of the GST. Also, even though a memory cell may be programmed in a same condition, a level of program current being applied to a memory cell may vary due to a change of the writing circuit.

In some embodiments, a level of program current (i.e., a RESET current or a SET current) is adaptively determined depending on an initial RESET current distribution for an array of memory cells, considering the variation described above. Consequently, a memory device may be relatively insensitive to a circuit variation and a process variation by adaptively performing a wafer burn-in or a RESET program operation according to a characteristic of memory cell. Thus, a RESET program error or a SET return program error may be minimized or reduced, and manufacturing yield may be improved.

In some embodiments, a level of RESET current in a program operation may be calculated by determining a representative RESET current value on the basis of a distribution of initial RESET currents of a chip, and then multiplying, adding, or subtracting the determined representative RESET current value and a set ratio (the set ratio may be any of RA_F (a preset firing ratio), RA_R (a preset RESET ratio), and RA_S (a preset SET ratio)).

Figure 5:
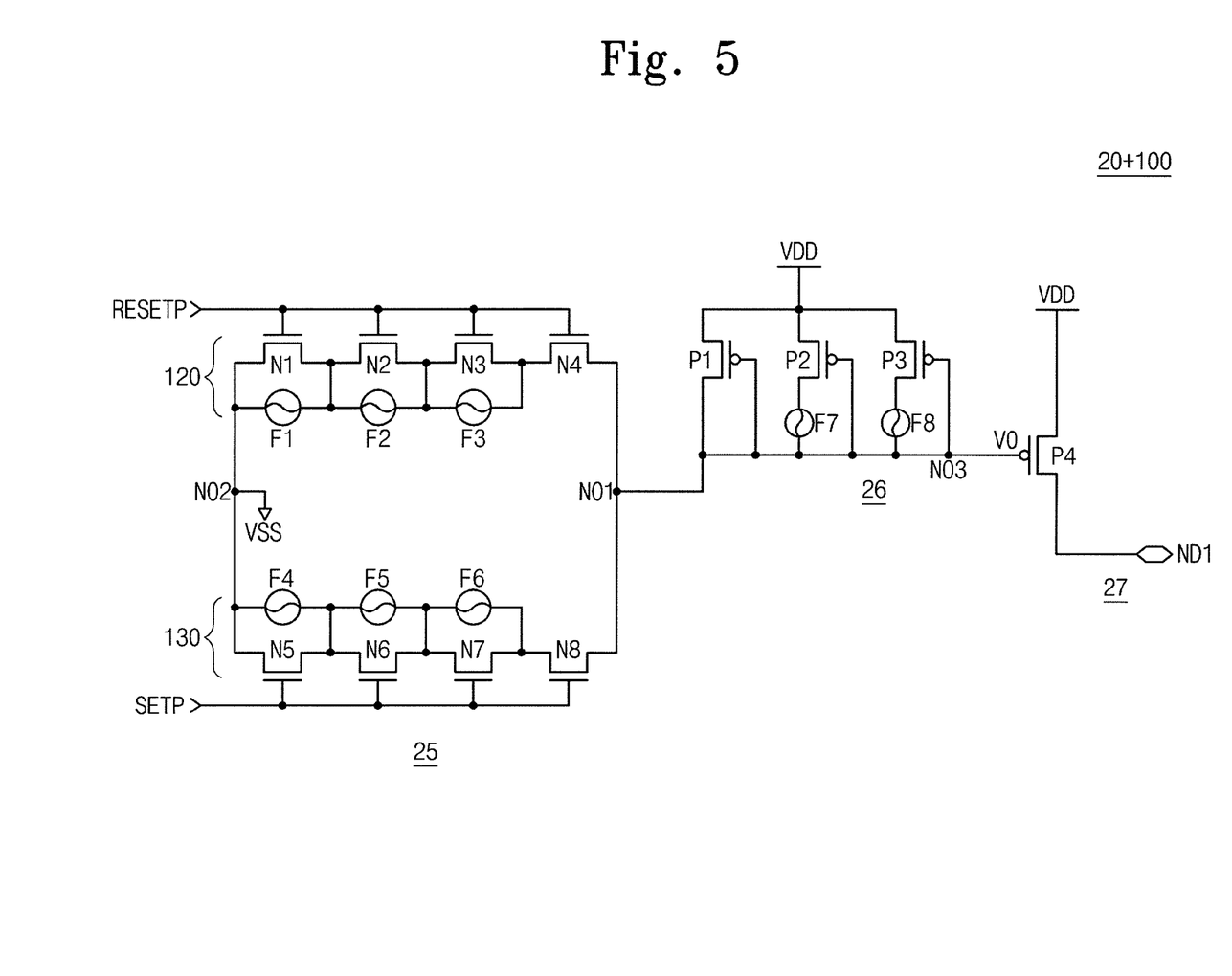
FIG. 5 illustrates an example of a trimming circuit applied to a writing circuit of FIG. 2.

FIG. 5 illustrates an example of trimming circuit applied to a writing circuit 20 of FIG. 2. In the example trimming circuit of FIG. 5, the trimming circuit includes a current control portion 25, an output voltage control portion 26, and a current drive portion 27.

In the example shown in FIG. 5, a RESET current control portion 120 of the current control portion 25 includes first through fourth NMOS transistors N1-N4 and first through third fuses F1-F3. The first through fourth NMOS transistors N1-N4 are serially connected to each other and receive a first selection pulse signal RESETP through their gate terminals. The first through third fuses F1-F3 are connected to the first through third NMOS transistors N1-N3, respectively. When the third fuse F3 is cut, a source current of the fourth NMOS transistor N4 only flows through the third NMOS transistor N3. However, when the third fuse F3 is not cut, a source current of the fourth NMOS transistor N4 flows to a source of the third NMOS transistor N3 through the third fuse F3 without passing through the third NMOS transistor N3.

Similarly, a SET current control portion 130 of the current control portion 25 includes fifth through eighth NMOS transistors N5-N8 and fourth through sixth fuses F4-F6. The fifth through eighth NMOS transistors N5-N8 are serially connected to each other and receive a second selection pulse signal SETP through their gate terminals. The fourth through sixth fuses F4-F6 are connected to the fifth through seventh NMOS transistors N5-N7, respectively. When the sixth fuse F6 is cut, a source current of the eighth NMOS transistor N8 only flows through the seventh NMOS transistor N7. However, when the sixth fuse F6 is not cut, a source current of the eighth NMOS transistor N8 flows to a source of the seventh NMOS transistor N7 through the sixth fuse F6 without passing through the seventh NMOS transistor N7. A node NO1 corresponds to a current supply terminal.

In the example shown in FIG. 5, the output voltage control portion 26 includes first through third PMOS transistors P1-P3 and seventh and eighth fuses F7 and F8. Source terminals of the first through third PMOS transistors P1-P3 are connected to a supply voltage VDD, and gate terminals of the first through third PMOS transistors P1-P3 are connected to a voltage output terminal VO. Drain terminals of the second and third PMOS transistors P2-P3 are connected to the voltage output terminal VO through the seventh and eighth fuses F7 and F8 respectively. A drain terminal of the first PMOS transistor P1 is directly connected to the voltage output terminal VO.

When the seventh fuse F7 is cut, the drain terminal of the second PMOS transistor P2 is electrically separated from the voltage output terminal VO and, thereby, a drive current of the second PMOS transistor P2 does not exist at the voltage output terminal VO. As a result, a voltage level of the node NO1 is equally lowered.

In the example shown in FIG. 5, the current drive portion 27 includes a PMOS transistor P4. The amount of write (program) current of the PMOS transistor P4, i.e., the magnitude of the write current, depends on a voltage level of the node NO1.

In FIG. 5, a permanent trimming method using a fuse is applied to a program operation mode. However, variable trimming may also be implemented, e.g., by applying a code for controlling resistance from the outside. Using the variable trimming method, a current level being applied in a firing operation mode including a wafer burn-in may be adaptively set according to an initial RESET current distribution.

The magnitude of the SET current pulse or the RESET current pulse applied to a resistance change memory cell in a program operation mode may be controlled by cutting the fuses after determining a representative RESET current value for an array of the resistance change memory cells on the basis of an initial RESET current distribution. The SET current pulse or the RESET current pulse may be adaptively controlled by a memory block unit. Thus, a memory cell array unit or a wafer unit according to the set representative RESET current value, a RESET program error, or a SET return program error may be minimized or reduced. Thus, a manufacturing yield of the resistance change memory device may be increased, and an endurance failure and a disturb failure of a memory cell may be minimized or reduced such that reliability of memory device may be improved.

Figure 6:
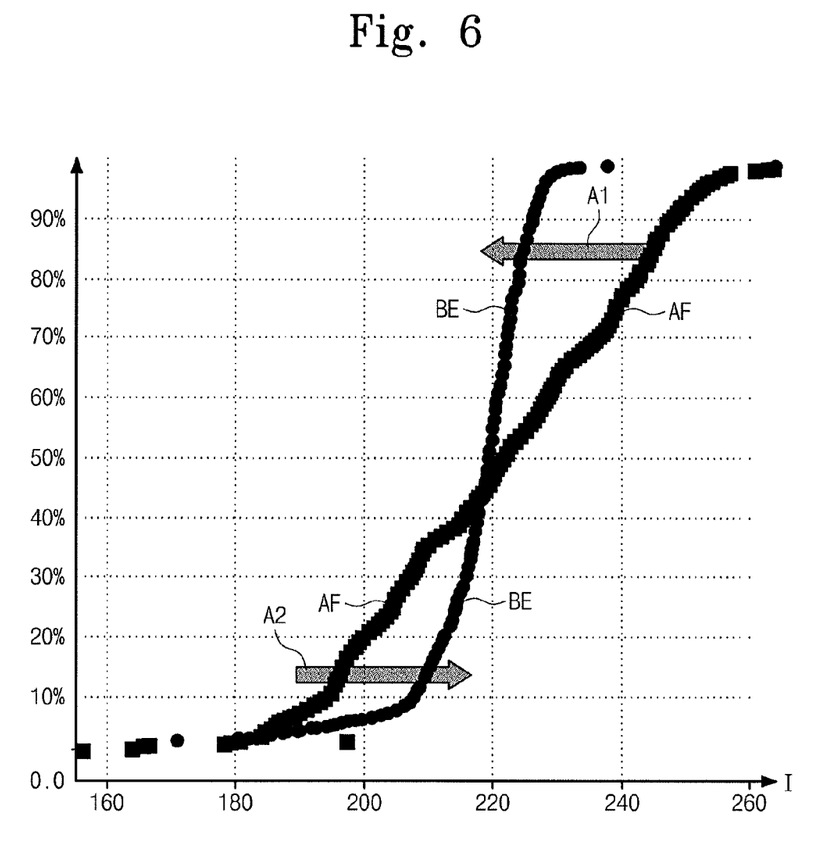
FIG. 6 illustrates a graph showing a shift of characteristic distribution of RESET current when firing the memory cell being applied to FIG. 2.

FIG. 6 illustrates a graph showing a shift of characteristic distribution of RESET current when firing the memory cell being applied to FIG. 2 by supplying a constant current to the memory cell.

In the graph of FIG. 6, a horizontal axis represents a RESET current value as milliampere (mA) unit. A vertical axis represents a quantity of memory cells as a percentage. A graph AF shows a state before WBI (burn-in or firing) is performed and a graph BE shows a state after WBI (the burn-in) is performed.

By comparing the graph AF to the graph BE, it can be seen that the magnitude of the RESET current may be different depending on a condition of WBI (wafer burn-in or firing). For example, when performing the WBI by supplying a constant current to a memory cell, even though chips are included in a same wafer, chips having a relatively small RESET current value may have a relatively large RESET current value after the WBI. An arrow A2 shows that the RESET current value increases after WBI. An arrow A1 shows that chips having a relatively large RESET current value before WBI may have a relatively small RESET current value after the WBI.

If a wafer burn-in current value supplied when the WBI is performed is relatively great, a peak value of RESET current becomes small. If a wafer burn-in current value is relatively small, a peak value of RESET current becomes great. A peak value of RESET current varies in the specific proportion depending on the magnitude of WBI current value.

In a PRAM, a resistance of a memory cell is stabilized after the WBI (or firing). If uniformly performing a wafer burn-in on all the chips by supplying a constant current, a RESET current value is not uniform (see FIG. 6). Thus, after repeatedly performing a program (several times to several hundreds of times), an initial RESET current distribution is measured. A representative RESET value is determined from the initial RESET current distribution, and a level of burn-in current is determined at each chip on the basis of the representative RESET value.

In some embodiments, the level of burn-in current being supplied when the wafer burn-in is performed is different at every individual chip. For a distribution graph like FIG. 8, when a distribution of an initial RESET current value of a chip is different at each chip, a wafer burn-in current, a SET program current, and a RESET program current may be determined considering the initial RESET current value of the chip. Thus, a RESET program error or a SET return program error may be minimized or reduced.

As described above, a manufacturing yield of a resistance change memory device may be increased, and an endurance failure and a disturb failure of a memory cell may be minimized or reduced, such that reliability of a memory device may be improved.

Figure 7:
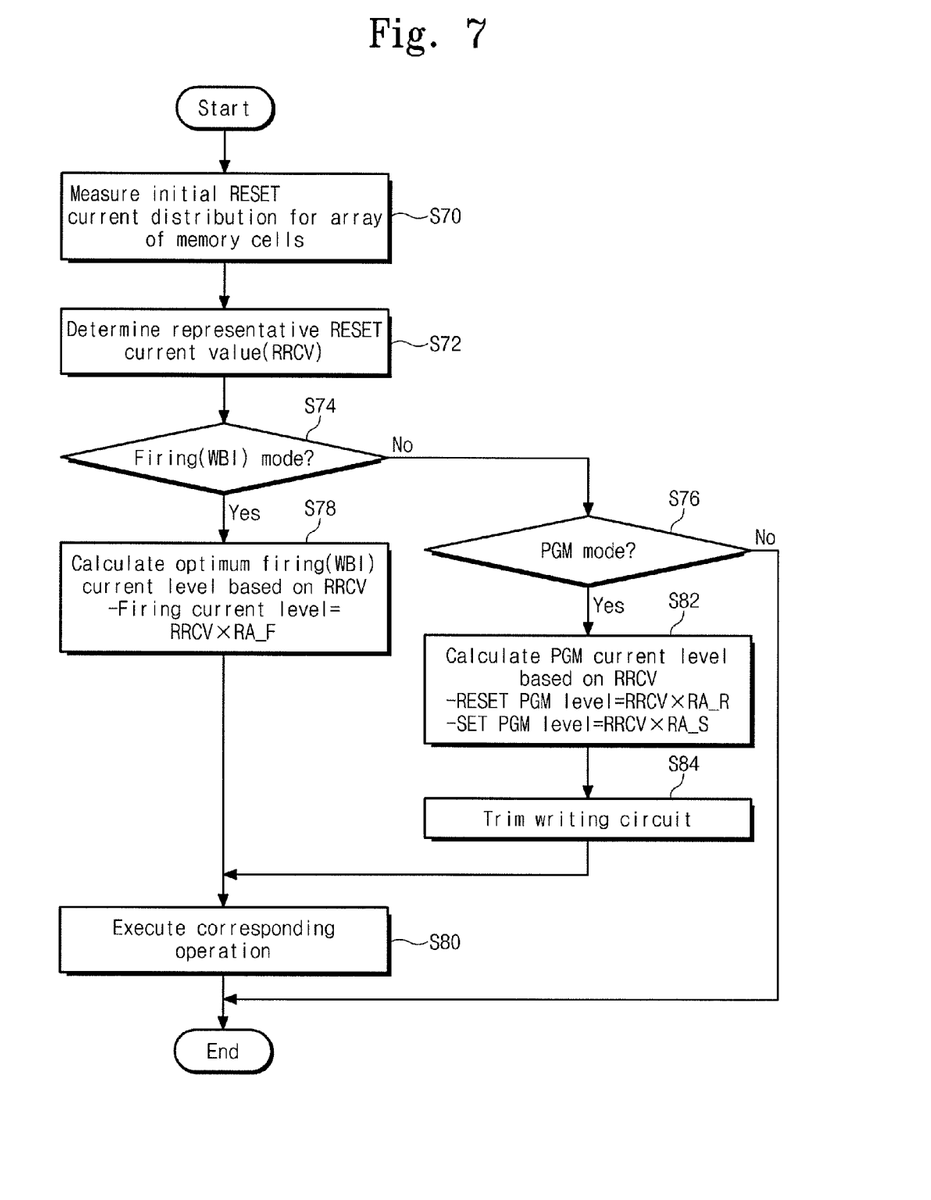
FIG. 7 illustrates a current trimming control flow chart in operation modes in accordance with some embodiments.

In some embodiments, a level of current being supplied may be adaptively set at each chip by a current trimming control flow as shown in FIG. 7.

FIG. 7 illustrates a current trimming control flow chart in operation modes in accordance with some embodiments.

In an operation S70, an initial RESET current distribution for an array of memory cells is measured. To improve reliability of the measured value, the initial RESET current distribution may be measured after supplying a constant current to resistance change memory cells (e.g., several tens of times to several thousands of times) to SET program the resistance change memory cells. If one chip among chips in a same wafer has a graph G1 of FIG. 8, another chip may have a graph G2 of FIG. 8. It is not necessary to measure all the memory cells in the array of memory cells. For example, an initial RESET current distribution for hundreds to thousands of the sampled memory cells may be measured.

In an operation S72, a representative RESET current value RRCV is determined on the basis of the measured initial RESET current distribution. The representative RESET current value RRCV may be determined by, e.g., taking a mean value or central peak value of the initial RESET current distribution. In the graph G1 of FIG. 8, the RRCV may be a RESET current value corresponding to K1.

In an operation S74, a check is performed to determine whether or not a current mode in a memory device is a firing mode including a WBI mode. In an operation S76, a check is performed to determine whether or not a current mode in a memory device is a program PGM mode.

In the operation of S74, if the current mode is a firing mode, an operation S78 is executed.

In the operation of S78, an optimum firing current level is calculated on the basis of the representative RESET current value RRCV. The firing current level is calculated by multiplying the representative RESET current value RRCV by the preset firing ratio RA_F. In some other cases, the firing ratio RA_F may be two or more. In some other cases, the firing current level may be calculated by adding a preset firing control value to the representative RESET current value RRCV or subtracting the preset firing control value from the representative RESET current value RRCV.

If the firing current level is calculated in the operation of S78, in an operation S80, the calculated firing current level is provided to memory cells of the array of memory cell and thereby a firing operation is executed.

The firing operation may be executed by the test device 2000 of FIG. 1 and in that case, a firing current differently determined at each chip is provided to the memory device 1000 of FIG. 1.

Figure 9:
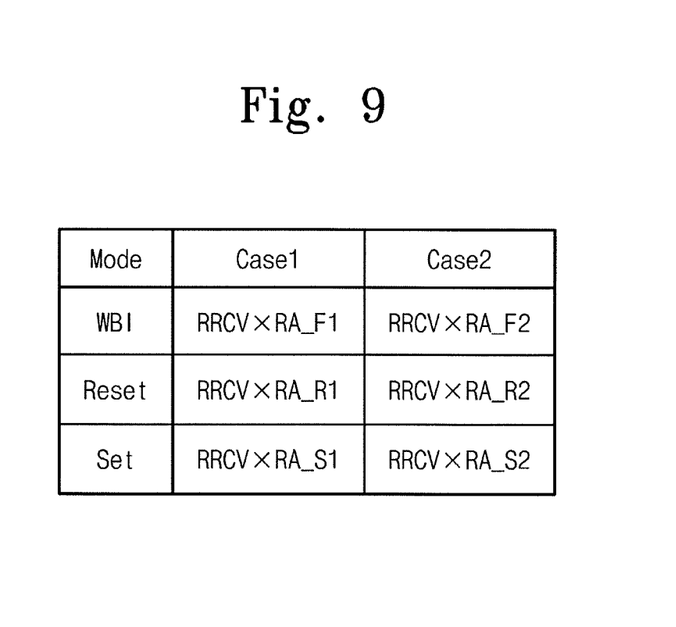
FIG. 9 illustrates a table of an example of calculating a current level at each operation mode according to some embodiments.

If the current mode is a program operation mode in an operation S76, an operation S82 is executed. In operation S82, an optimum program current level is calculated on the basis of the representative RESET current value RRCV. The program current level may be classified into a RESET program current level and a SET program current level. A program ratio of when executing a RESET program and a program ratio of when executing a SET program may be different to each other. The RESET program current level may be calculated by multiplying the representative RESET current value RRCV by the preset RESET program ratio RA_R. In some other embodiments, the RESET program ratio RA_R may be two or more as illustrated in FIG. 9. In some other embodiments, the RESET program level may be calculated by adding a preset RESET program control value to the representative RESET current value RRCV or subtracting the preset RESET program control value from the representative RESET current value RRCV.

A SET program current level may be calculated by multiplying the representative RESET current value RRCV by the preset SET program ratio RA_S. In some other embodiments, the SET program ratio RA_S may be two or more as illustrated in FIG. 9. In some embodiments, the SET program level may be calculated by adding a preset SET program control value to the representative RESET current value RRCV or subtracting the preset SET program control value from the representative RESET current value RRCV.

If a program current level is calculated in the operation of S82, in an operation S84, the calculated program current level may be trimmed through a trimming circuit. In this case, the SET program current level or the RESET program current level may be trimmed by a circuit as shown in FIG. 5. After the trimming operation is executed, in the operation of S80, a trimmed program current level is provided to memory cells in the array of memory cells and a program operation is executed.

Figure 8:
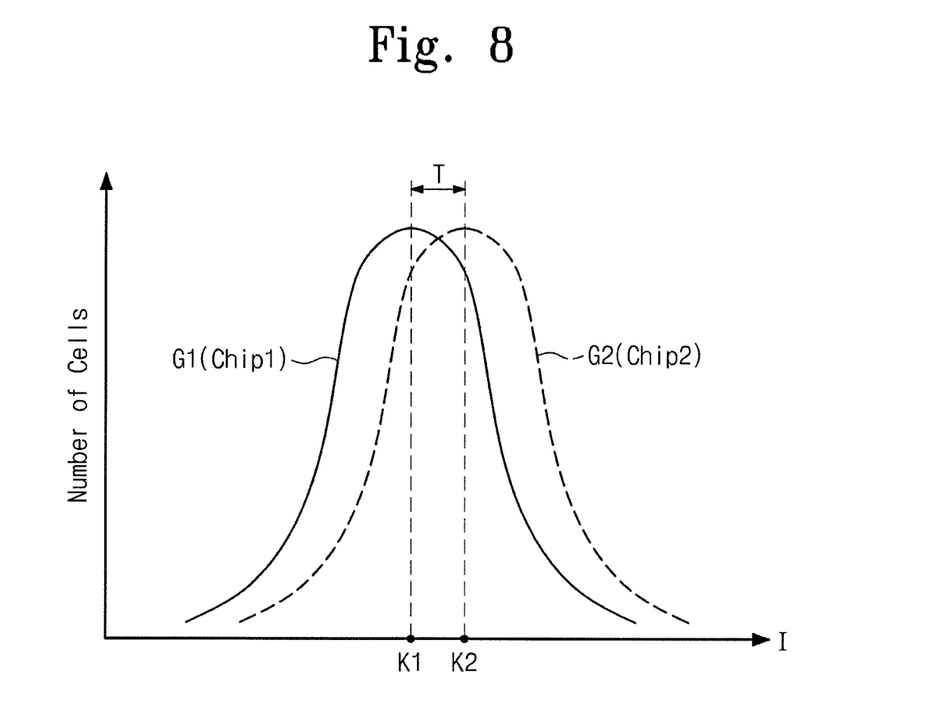
FIG. 8 illustrates a graph of an example of difference of initial RESET current distribution at each memory device of FIG. 1.

FIG. 8 illustrates a graph of an example of a difference of initial RESET current distribution at each memory device of FIG. 1.

In FIG. 8, as described above, graphs G1 and G2 show initial RESET current distributions that are different from each other, e.g., due to a circuit or process variation. In the graph, a horizontal axis represents the magnitude of the initial RESET current and a vertical axis represents a quantity of memory cells. In an initial RESET current distribution for memory cells that belong to two chips, an initial reset peak value of one chip is shifted by T from an initial reset peak value of the other chip. In some embodiments, a wafer burn-in or a program is properly performed considering the shift value.

FIG. 9 illustrates a table of an example of calculating a current level at each operation mode according to some embodiments.

As described above, in a WBI mode, a RESET program operation mode, or a SET program operation mode, a set ratio multiplied by RRCV may be two or more. The set ratio may be different at each operation mode. For example, a RESET program ratio RA_R1 in a case 1 is set to be different from a RESET program ratio RA_R2 in a case 2. Case 1 is a case in which the initial RESET current distribution belongs to a first range that is set. Case 2 is a case in which the initial RESET current distribution is outside of the first range that is set.

Referring back to FIG. 2, an execution example of a RESET program operation will be described. A fuse trimming is executed through the trimming circuit 100 considering the initial RESET current distribution. As a result, in the RESET program operation mode, an optimum RESET program current relative to the corresponding chip exists on a node ND1.

A general program operation of programming data in the memory cell 72 begins when a word line WL1 is activated by the row decoder 50 receiving a row address XADD and a column gate 80-2 is driven by the column decoder 40 receiving a column address YADD. At this time, the RESET program current, generated by the writing circuit 20 receiving write (program) data WDATA and an enable signal EN, is supplied to a data line DL through the node ND1. The array control portion 60 maintains the selected bit line BL1 at a power supply voltage or a proper voltage level in response to a pulse signal nPULSE and an enable signal CE. Unselected bit lines are maintained at a ground or floating state.

The phase change memory cell 72 may be reset by the pulse type of RESET program current to store data "1". When the phase change memory cell 72 is set by a SET current pulse, the phase change memory cell 72 may store data "0".

When the phase change memory cell 72 is a single bit memory cell, data "1" or data "0" is stored in the phase change memory cell 72. When the phase change memory cell 72 is a multi bit memory cell, data "00", data "01", data "10" or data "11" may be stored.

When trimming the RESET current level depending on the initial RESET current distribution for the array of resistance change memory cells, the RESET program error or the SET return program error may be minimized or reduced and, thereby, manufacturing yield of resistance change memory device may increase. Also, an endurance failure and disturb failure of a memory cell may be minimized or reduced and, thereby, reliability of memory device may be improved.

In a read operation, the read circuit 30 of FIG. 2 is activated. The read circuit 30 reads data by supplying a current to the selected phase change memory cell 72 and detecting a level change of sensing node NSA generated by a current Icell flowing through the selected phase change memory cell 72. The read circuit 30 may include a precharge portion 38, a biasing portion 34, a clamping portion 32, and a sense amplifier 36.

The precharge portion 38 precharges the sensing node NSA to a constant level, for example a power supply voltage VDD for a precharge period before a sensing operation. The precharge portion 38, as illustrated in FIG. 2, is connected between the power supply voltage VDD and the sensing node NSA, and may be embodied by a PMOS transistor receiving a precharge control signal VPRE through its gate.

The biasing portion 34 supplies a biasing current to the sensing node NSA to prevent the reduction in a level of the sensing node NSA caused by a current Icell flowing through the selected phase change memory cell 72. When the phase change memory cell 72 is in the SET state, the resistance of phase change material may be small, such that the amount of penetration current Icell is large. When the phase change memory cell 72 is in the RESET state, the resistance of phase change material may be great, such that the amount of penetration current Icell is small.

The amount of current provided from the biasing portion 34 is such as to compensate the penetration current Icell in the RESET state. In this case, a level of the sensing node NSA in the SET state is reduced while a level of the sensing node NSA in the RESET state is maintained constant. Thus, a difference between the level of sensing node NSA in the RESET state and the level of sensing node NSA in the SET state may be great. Thus, it may be easy to distinguish between the SET state and the RESET state. By doing so, a sensing margin may be increased.

The biasing portion 34, as illustrated in FIG. 2, is connected between the power supply voltage VDD and the sensing node NSA, and may be embodied by a PMOS transistor receiving a biasing control signal VBIAS through its gate terminal.

The clamping portion 32 clamps a level of bit line BL within the proper range to read. The clamping portion 32 clamps the level of bit line BL to a predetermined level lower than a critical voltage of the phase change material. This is because, if the level of the bit line BL is equal to or higher than the critical voltage, the phase of the phase change material of the selected phase change memory cell 72 may be changed. The clamping portion 32, as illustrated in the drawing, is connected between the bit line BL and the sensing node NSA, and may be an NMOS transistor receiving a clamping control signal VCLAMP through its gate terminal.

The sense amplifier 36 compares a level of the sensing node NSA and a set reference voltage VREF, and outputs results of the comparison to an output terminal OUT.

The sense amplifier 36 is embodied by a voltage sense amplifier comparing a level of the sensing node NSA with the reference voltage VREF. In some other embodiments, a current sense amplifier may be adopted which senses a variation of current flowing out through the bit line BL of the selected phase change memory cell 72 with respect to a reference current.

The array control portion 60 includes transistors turned on in response to an enable signal CE to apply a power supply voltage VDD to a bit line of selected memory cell. The array control portion 60 may further include transistors making a bit line BL become a ground voltage level VSS in response to a pulse signal nPULSE before a read operation or a write (program) operation.

In the case of PRAM, the PRAM may properly trim a program current by reading a current value through a current monitoring pad and comparing the read current value with a reference value. In some embodiments, if adaptively performing a wafer burn-in or a program at each chip (or at each wafer, at each memory block) considering the initial RESET current distribution, yield may increase by 5%-7%. For example, if ten million chips are produced each month, the price per chip is one dollar and yield is increased by 5%, according to some embodiments, an economic effect of six million dollars per year could be expected.

Figure 10:
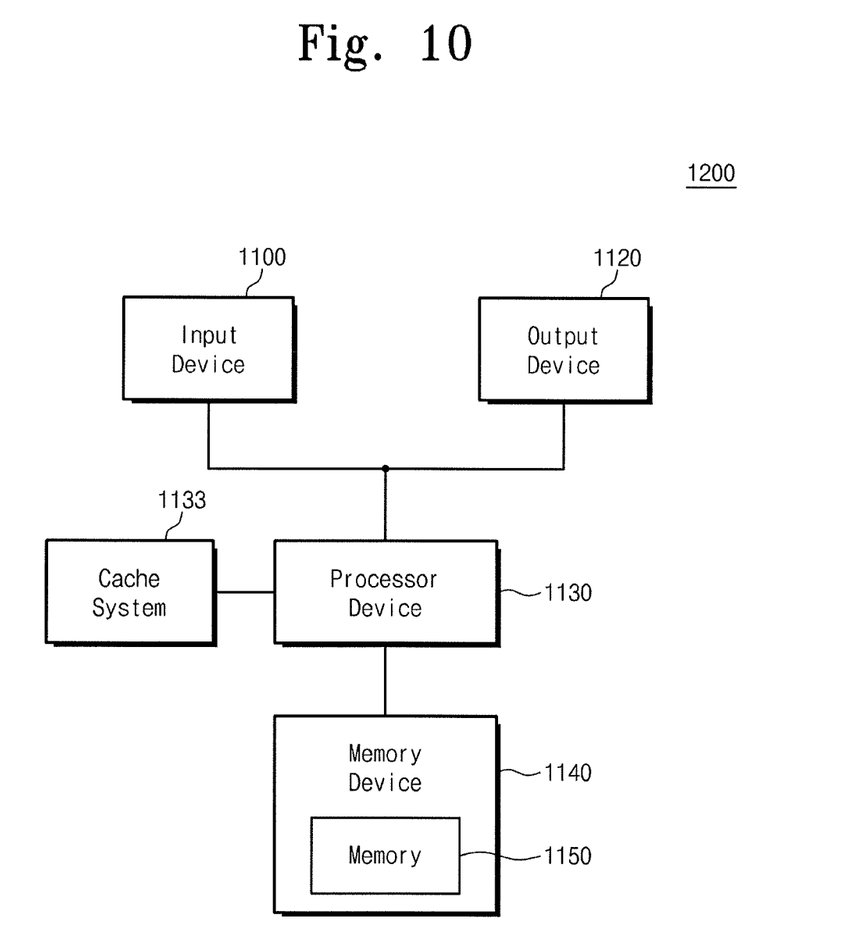
FIG. 10 illustrates a block diagram of a first application example adopted in an electronic system.

FIG. 10 illustrates a block diagram of a first application example adopted in an electronic system.

In the example shown in FIG. 10, an electronic system 1200 includes an input device 1100, an output device 1120, a processor device 1130, a cache system 1133, and a memory device 1140.

In FIG. 10, the memory device 1140 may include a resistance change memory device 1150 such as a PRAM. The processor device 1130 controls the input device 1100, the output device 1120, and the memory device 1140 through corresponding interfaces. In the case of the first application, if the processor device 1130 applies the memory device 1140 adopting the resistance change memory device 1150 illustrated in FIG. 2, an endurance failure and a disturb failure of memory cells of the resistance change memory device 1150 may be minimized or reduced. Thus, reliability and operation performance of electronic system may be improved.

Figure 11:
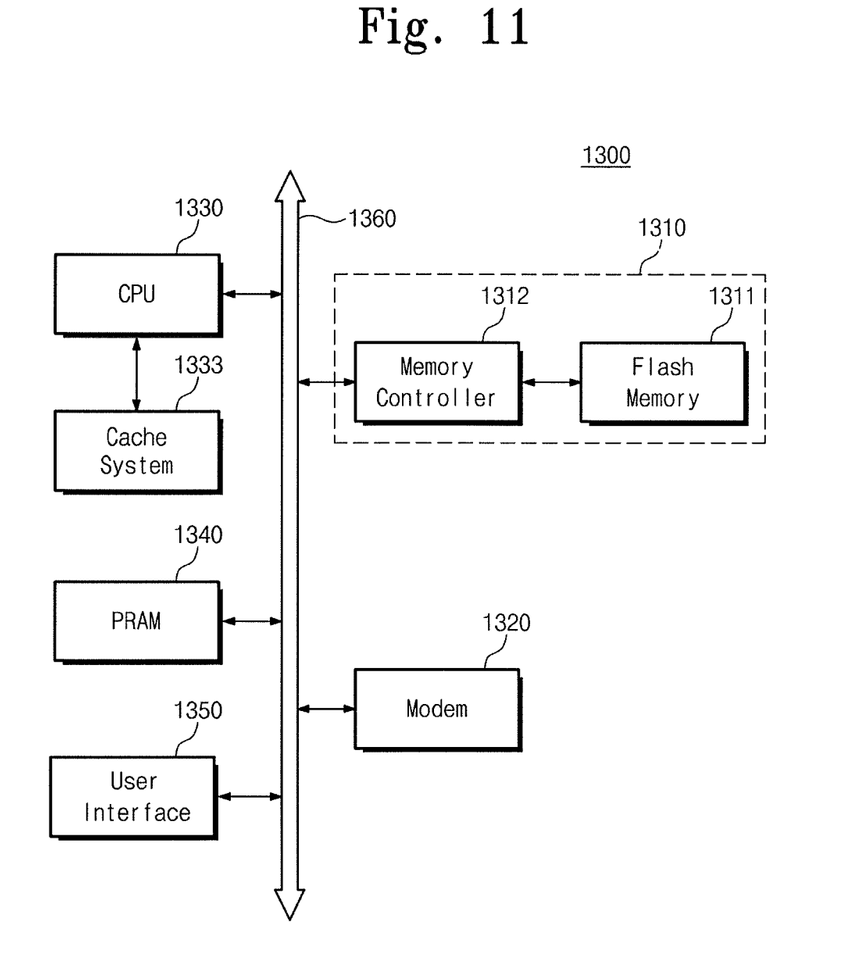
FIG. 11 illustrates a block diagram of a second application example adopted in a data processing device.

FIG. 11 illustrates a block diagram of a second application example adopted in a data processing device.

Referring to FIG. 11, a PRAM 1340 in accordance with some embodiments may be built in the data processing device such as a mobile device or a desk top computer. In the case of the second application example, if the data processing device adopts the PRAM 1340 like FIG. 2, an endurance failure and a disturb failure of memory cells may be minimized or reduced. Thus, reliability and operation performance of the data processing device may be improved. Also, since memory device having a manufacturing cost lowered due to a yield increase may be built in the data processing device, a manufacturing cost of data processing device may be lowered.

In FIG. 11, the data processing device 1300 may include a flash memory system 1310, a modem 1320, a central processing unit 1330, a cache system 1333, a PRAM 1340, and a user interface 1350 that are connected to one another through a system bus 1360. The flash memory system 1310 may be constituted to be the same with a general memory system, and may include a memory controller 1312 and a flash memory 1311. The flash memory system 1310 may permanently store data processed by the central processing device 1330 or data received from the outside. The flash memory system 1310 may be embodied by a solid state disk (SSD). In this case, the data processing device 1300 may stably store huge amounts of data in the flash memory system 1310. Although not illustrated in the drawing, the data processing device 1300 may further include an application chipset, a camera image processor CIS, or an input/output device.

Constituent elements constituting the data processing device 1300 may be embodied by one of various types of packages. For example, the constituent elements can be packaged by various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), and wafer-level processed stack package (WSP).

Figure 12:
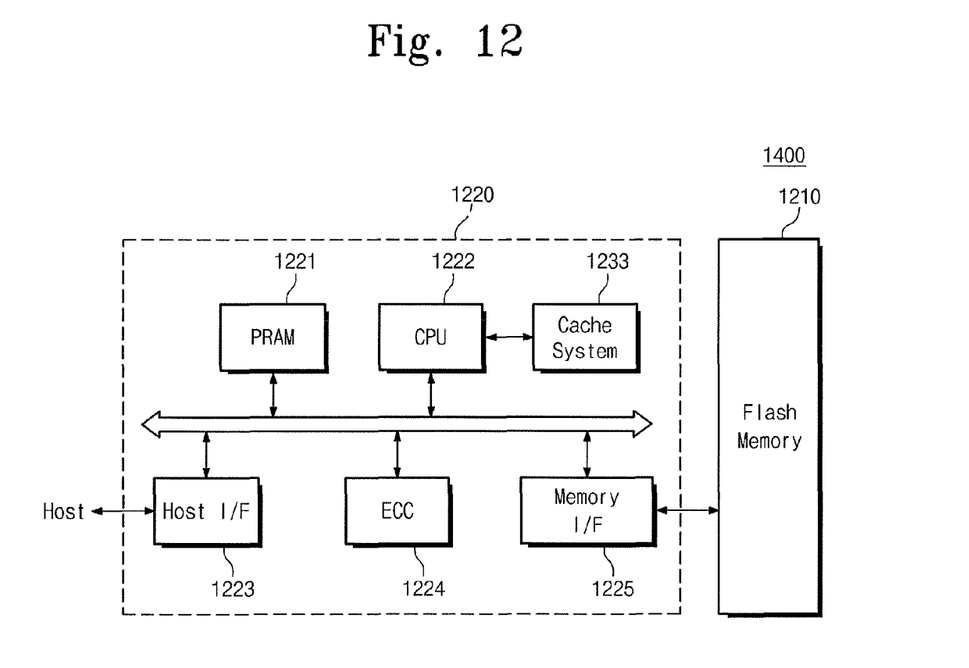
FIG. 12 illustrates a block diagram of a third application example adopted in a memory card.

FIG. 12 illustrates a block diagram of a third application example adopted in a memory card.

Referring to FIG. 12, a memory card 1400 for supporting a storage capability of huge amounts of data may include a PRAM 1221 in accordance with some embodiments. The PRAM 1221 may be included in the memory controller 1220. In FIG. 12, if the memory card 1400 adopts the PRAM 1221, a RESET program operation of the PRAM 1211 may be stabilized and thereby the whole performance of memory card may be improved.

The memory card 1400 includes a memory controller 1220 controlling the whole data exchange between a host and a flash memory 1210.

In the memory controller 1220, the PRAM 1221 may be used as a working memory of the central processing unit (CPU) 1222. A host interface 1223 performs an exchange interface between the memory card 1400 and the host. An error correction code 1224 detects and corrects an error included in data read from the flash memory 1210. A memory interface 1225 performs data interfacing between the CPU 1222 and the flash memory 1210. The CPU 1222 controls the whole operation related to data exchange of the memory controller 1220. Although not illustrated in the drawing, the memory card 1400 may further include a ROM (not shown) to store code data for an interface with the host.

Figure 13:
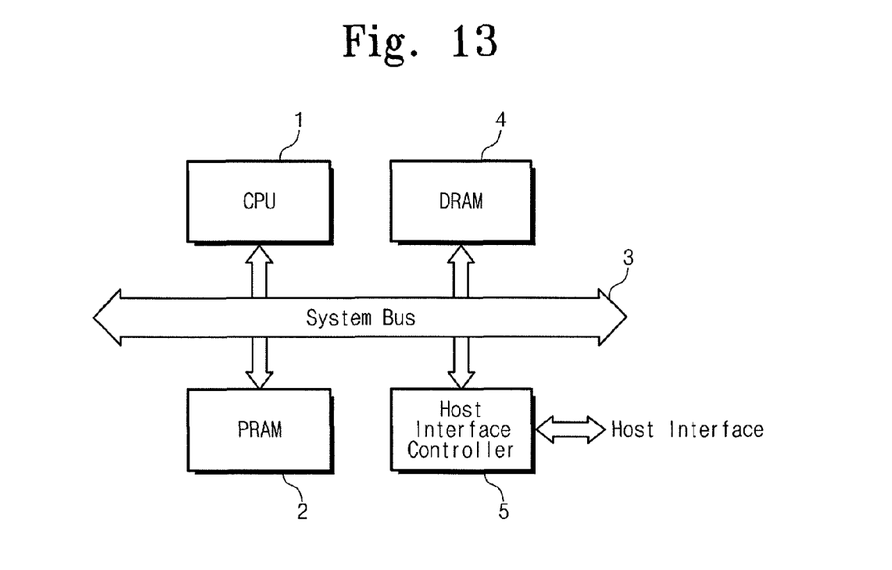
FIG. 13 illustrates a block diagram of a fourth application example adopted in a portable terminal.

FIG. 13 illustrates a block diagram of a fourth application example adopted in a portable terminal.

Referring to FIG. 13, a portable terminal such as a PMP, a cellular phone, or a smart phone may include a CPU 1, a PRAM 2, a DRAM 4, and a host interface controller 5 that are connected to one another through a system bus 3.

In the case of portable terminal, a degree of compactness may greatly affect the competitive edge of the product. Thus, it is desirable to minimize an area occupied by the PRAM 2 and the DRAM 4. When mounting a dual processor for a dual processing operation, it is not necessary to set the PRAM 2 and the DRAM 4 in every processor. In this case, one PRAM 2 or one DRAM 4 may internally have a dual port and a common memory region. In FIG. 13, when adopting the PRAM 2 as a resistance change memory device to apply it to a portable terminal, the RESET program error or the SET return program error of the PRAM 2 may be minimized or reduced. Thus, the whole performance of portable terminal adopting the PRAM 2 may be improved.

By way of summation and review, next-generation devices that do not need a refresh while having a nonvolatile feature are being studied as demand for high integration and low power of semiconductor memory device increases. Examples of next-generation devices include a phase change random access memory (PRAM) using a phase change material, a resistive random access memory (RRAM) using a material having a variable resistance characteristic, and a magnetic random access memory (MRAM). One common point among such materials for constituting a memory cell in the next-generation device is that their resistances are changed depending on a current or a voltage that are applied.

In the resistance change memory device, a unit memory cell may include one variable resistance device and one switching device. The variable resistance device may be connected between a bit line and a switching device, and the switching device may be connected between the variable resistance device and a word line. The resistance change memory device may include a variable resistance memory cell array including unit memory cells.

The resistance change memory device may be classified into PRAM, RRAM, and MRAM according to a kind of variable resistance device constituting a memory cell. For example, in the case that a variable resistance device is formed of a phase change material GST (Ge—Sb—Te) and a resistance of the variable resistance device can be varied by heat-induced phase change, the resistance change memory device may be classified as a PRAM.

In the case that the variable resistance device is formed of an upper electrode, a lower electrode, and a transition metal oxide between the upper electrode and the lower electrode, the resistance change memory device may be classified as a PRAM.

In the case that the variable resistance device is formed of an upper electrode of magnetic substance, a lower electrode magnetic substance, and a dielectric material between the upper electrode of magnetic substance and the lower electrode of magnetic substance, the resistance change memory device may be classified as an MRAM.

The PRAM cell may be placed in a RESET state (amorphous state) by supplying a short pulse type of current (RESET current) to the PRAM cell. A level of programming current may be higher than a level of the RESET current. However, continuously increasing a programming current may cause the PRAM cell to be placed in an over-programmed state such that the PRAM cell cannot then be placed in the SET state (crystalline state) by the SET current. Also, if the programming current is excessive compared with the RESET current, an endurance failure or a disturb failure may occur, and thereby reliability of the PRAM may be deteriorated.

A RESET current of PRAM cell may varies depending on, e.g., a thickness and a critical dimension (CD) of the lower electrode, the interface state between a lower electrode and GST, or the height, the thickness, or the concentration of GST. Also, a current supplied from the write driver may not maintain a constant level (e.g., due to a transistor threshold voltage variation, a resistance change of resistor, or a resistance change of VIA contact) even though all the voltage operation conditions are same. Also, when measuring a current through a monitoring pad, a current actually being supplied and a current measured through a monitoring pad may be different, e.g., because of a resistance of monitoring pad. Consequently, a program current of the RESET or SET pulse may depart from an optimum condition, e.g., due to the above-described variances of wafer to wafer and chip to chip in the PRAM cell and/or the above-described variances of the write driver circuit.

In the case that an endurance failure of memory cell and a disturb failure of memory cell occur because a wafer burn-in or a RESET program operation are not properly performed in a resistance change memory device like a PRAM, manufacturing yield may be decreased and reliability of memory device may be deteriorated. As described above, according to some embodiments, a RESET program error or a SET return program error may be minimized or reduced and, thereby, manufacturing yield of a resistance change memory device may increase. Also, an endurance failure and a disturb failure of memory cell may be minimized or reduced and, thereby, reliability of a memory device may be improved.

As described above, a resistance change memory device according to an embodiment may include an array of resistance change memory cells, and may include a writing circuit configured to reset a selected memory cell to a high resistance state by supplying a RESET current to the selected memory cell in the array of resistance change memory cells in a program operation mode. According to an embodiment, a level of the RESET current depends on a distribution of initial RESET currents for the array of resistance change memory cells. According to an embodiment, a RESET program error and/or a SET program error may be minimized or reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A resistance change memory device, comprising:
an array of resistance change memory cells; and
a writing circuit configured to reset a selected memory cell to a high resistance state by supplying a RESET current to the selected memory cell in the array of resistance change memory cells in a program operation mode, wherein a level of the RESET current depends on a distribution of initial RESET currents for the array of resistance change memory cells, wherein the writing circuit is operationally connected to a trimming circuit for trimming a program current level.

2. The resistance change memory device as claimed in claim 1, wherein the resistance change memory cells are constituted by phase change memory cells changed to an amorphous state by the RESET current.

3. The resistance change memory device as claimed in claim 1, wherein the distribution of initial RESET currents is measured after performing, one or more times, a SET program or a RESET program on the resistance change memory cells.

4. The resistance change memory device as claimed in claim 1, wherein the level of RESET current is calculated by determining a representative RESET current value for the array of resistance change memory cells on the basis of a peak value of the distribution of initial RESET currents and then multiplying the determined representative RESET current value by a RESET program ratio.

5. The resistance change memory device as claimed in claim 1, wherein the level of RESET current is calculated by:
determining a representative RESET current value for the array of resistance change memory cells on the basis of a central value of the distribution of initial RESET currents, and then:
adding a RESET program control value to the determined representative RESET current value, or
subtracting a RESET program control value from the determined representative RESET current value.

6. The resistance change memory device as claimed in claim 1, wherein the trimming circuit comprises at least one of a fuse, an anti-fuse, and a nonvolatile memory.

7. The resistance change memory device as claimed in claim 1, wherein the resistance change memory device is operable in a firing operation mode, in which:
   the writing circuit supplies a firing current to memory cells in the array of resistance change memory cells, and
   a level of the firing current is determined by multiplying a representative RESET current value, obtained on the basis of the distribution of initial RESET current, by a firing ratio.

8. The resistance change memory device as claimed in claim 7, wherein a wafer burn-in operation is performed in the firing operation mode.

9. The resistance change memory device as claimed in claim 1, wherein the resistance change memory device is operable in a firing operation mode, in which:
   the writing circuit supplies a firing current to memory cells in the array of resistance change memory cells, and
   a level of the firing current is determined by:
      adding a representative RESET current value, obtained on the basis of the distribution of initial RESET current, to a firing ratio, or
      subtracting a representative RESET current value, obtained on the basis of the distribution of initial RESET current, from a firing ratio.

10. A method of current trimming a memory, the method comprising:
   measuring a distribution of initial RESET currents for an array of resistance change memory cells;
   determining a representative RESET current value for the array of resistance change memory cells on the basis of the distribution of initial RESET currents; and
   determining a level of program current on the basis of the representative RESET current value, wherein the level of the program current is determined by multiplying the representative RESET current value by a program ratio.

11. The method as claimed in claim 10, wherein the memory is operable in a RESET program operation mode, and the program ratio is a RESET program ratio.

12. The method as claimed in claim 10, wherein the memory is operable in a SET program operation mode, and the program ratio is a SET program ratio.

13. The method as claimed in claim 10, further comprising a wafer burn-in operation mode, the wafer burn-in operation mode including determining a level of wafer burn-in current on the basis of the representative current value.

14. A method of programming a memory device that includes a memory array of variable resistance memory cells, the method comprising:
   identifying a variable resistance memory cell, among the variable resistance memory cells of the memory array, that is to be programmed;
   after identifying the variable resistance memory cell, determining a first state of the variable resistance memory cell, the first state being either a RESET state or a SET state; and
   after determining the first state of the variable resistance memory cell, changing the first state of the variable resistance memory cell to a second state by applying a pulse of electrical current to the variable resistance memory cell, the second state being different from the first state, the second state being either the RESET state or the SET state, the pulse of electrical current including a first current component and a second current component, the first current component being derived from a RESET current distribution obtained by wafer-level testing of the memory array and at least one other memory array, the memory array and the at least one other memory array having been fabricated on a same wafer.

15. The method as claimed in claim 14, wherein the second state is the RESET state, and the second current component is a preset RESET current having a magnitude that is determined prior to fabrication of the wafer.

16. The method as claimed in claim 15, wherein the pulse of electrical current is fixed by opening one or more fuses in the memory device after fabrication of the wafer, the fuses that are opened being determined with reference to the RESET current distribution.

* * * * *